United States Patent

Tyan

Patent Number: 5,752,685
Date of Patent: May 19, 1998

[54] VACUUM PENCIL HOLDER WITH TURNABLE WAND STAND

[75] Inventor: Joseph Tyan, Hsinchu Hsien, Taiwan

[73] Assignee: United Microelectronics Corporation, Taiwan

[21] Appl. No.: 697,001

[22] Filed: Aug. 16, 1996

[30] Foreign Application Priority Data

Jun. 28, 1996 [TW] Taiwan ................... 85209837

[51] Int. Cl.$^6$ ........................................ E04G 3/00
[52] U.S. Cl. ..................... 248/218.4; 248/219.4; 248/125.7; 403/49; 403/175
[58] Field of Search ............... 248/218.4, 219.2, 248/219.3, 219.4, 228.8, 122.1, 125.7, 125.9, 304, 316.8, 315; 403/49, 175, 230, 241, 396

[56] References Cited

U.S. PATENT DOCUMENTS

| | | | |
|---|---|---|---|
| 3,923,278 | 12/1975 | Marcil | 248/304 |
| 5,273,246 | 12/1993 | Stahara et al. | 248/218.4 |
| 5,409,190 | 4/1995 | Mattox | 248/315 |
| 5,575,580 | 11/1996 | Parrish et al. | 248/219.4 X |
| 5,605,410 | 2/1997 | Pantev | 403/175 X |

Primary Examiner—Ramon O. Ramirez
Assistant Examiner—Anita M. King
Attorney, Agent, or Firm—Rabin, Champagne, & Lynt, P.C.

[57] ABSTRACT

A vacuum pencil holder for holding a vacuum pencil used for picking up semiconductor dies or chips during fabrication of integrated circuit devices. The vacuum pencil holder has a wand stand adjustable in angular position about an elongated supportive member to which it is fastened, so that a vacuum pencil placed on the wand stand can always be turned to a position within reach of a fabrication engineer. The vacuum pencil holder includes a curved piece integrally joined to the wand stand. A pair of bearing members, each of which is substantially half-cylinder shaped, are attached to opposite sides of the elongated supportive member so as to form a cylindrical bearing member surrounding the elongated supportive member. The curved piece is slidably inset in slots formed on the curved surface of the two bearing members. The vacuum pencil holder can thus be turned about the elongated supportive member, allowing the wand stand to be adjusted in position.

9 Claims, 5 Drawing Sheets

VACUUM PENCIL HOLDER WITH TURNABLE WAND STAND

BACKGROUND OF THE INVENTION

1. Field of the Invention

This invention relates to a vacuum pencil holder for holding a vacuum pencil, which is a pencil-like tube connected to a small vacuum pump for picking up semiconductor dies or chips during fabrication of integrated circuit devices.

2. Description of the Related Art

In semiconductor fabrication labs, a vacuum pencil is an often-used device for picking up semiconductor dies or chips during fabrication of integrated circuit devices. The vacuum pencil consists of a wand and a tip. When not in use, the vacuum pencil is usually placed in a dedicated holder (which is hereafter referred to as a vacuum pencil holder) mounted nearby the desk or platform where the fabrication engineer is working. FIG. 1 shows a perspective view of a conventional vacuum pencil holder which is manufactured and supplied by the ERCIF company of France. This vacuum pencil holder 10 includes a wand stand 12 which is integrally molded with a pair of finger-like portions 14a, 14b which define a pair of slots 16a, 16b for holding therein a vacuum pencil (not shown). Further, the back of the wand stand 12 is formed with a recess 18 to which the vacuum pencil (not shown) can be hooked so as to secure the pencil in position.

The wand stand 12 is fastened to an elongated supportive member 30 by an adhesive piece 20 which is coated on both sides with an adhesive substance. The elongated supportive member 30 can be, for example, a nearby fixed setting, such as the leg of a desk where the fabrication engineer is working or a post mounted on the desk. Further, a pair of straps 40 are bonded to the adhesive piece 20 to connect the wand stand 12 to the elongated supportive member 30 more securely.

A drawback to the vacuum pencil holder of FIG. 1, however, is that the wand stand 12 can be fixedly fastened only to the elongated supportive member 30, and cannot be adjusted in position around the elongated supportive member 30. The fabrication engineer thus cannot adjust the wand stand 12 as he/she wishes, to a position within convenient reach of his/her hand. Further, a wand stand 12 fastened to the elongated supportive member 30 by the adhesive piece 20 and straps 40 can easily be jarred loose if someone accidentally bumps into the vacuum pencil holder. There exists, therefore, a need for a vacuum pencil holder which allows the wand stand to be adjusted in position around the supportive member, and which also can be fastened more securely to the supportive member.

SUMMARY OF THE INVENTION

It is therefore an object of the invention to provide a vacuum pencil holder having a wand stand which is adjustable in position around a supportive member, so that the vacuum pencil can always be placed at a position within convenient reach of a fabrication engineer.

It is another object of the invention to provide a vacuum pencil holder which can be securely fastened to its supportive member.

In accordance with the foregoing and other objects of the invention, a new and improved vacuum pencil holder is provided. The vacuum pencil holder includes a wand stand for holding a vacuum pencil and a curved piece joined to the wand stand. A pair of bearing members, each substantially half-cylindrical in shape, are provided for attachment to opposite sides of the elongated supportive member, so as to form a cylindrical bearing member surrounding the elongated supportive member. Each bearing member has a curved surface and a cutaway portion formed on an opposite surface. At opposite first and second curved ends of the curved surface there are provided opposing first and second flanges. The two flanges define a pair of half-circular slots on the curved surface. The cutaway portions of the two bearing members are shaped in such a manner that when the bearing members are mated to each other, the cut-away portions form an opening which matches the circumferential shape of the elongated supportive member.

With the bearing members mated to each other, the curved piece is slidably inset in the half-circular slots, so that the curved piece may be turned about the combined bearing members. Thus, when the bearing members are fixed to the supportive member, the wand stand may be turned about the elongated supportive member. The wand stand is thus adjustable in position so that a vacuum pencil placed on the wand stand can always be adjusted to a position within convenient reach of the fabrication engineer.

BRIEF DESCRIPTION OF THE DRAWINGS

The invention can be more fully understood from the following detailed description of the preferred embodiments, with reference made to the accompanying drawings, wherein.

DETAILED DESCRIPTION OF THE PREFERRED EMBODIMENT

Figure 4:
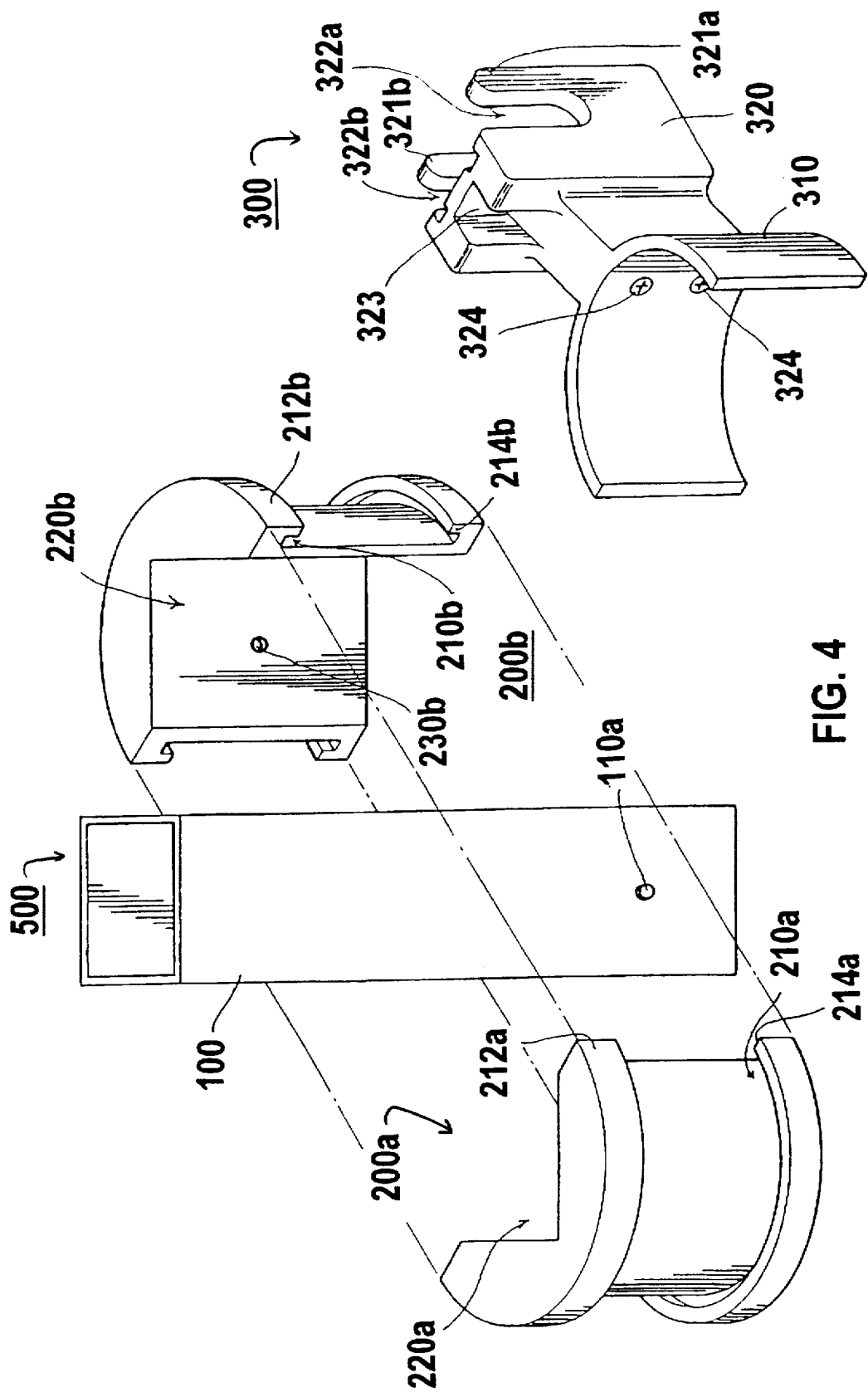
FIG. 4 is an exploded perspective view of the vacuum pencil holder according to the invention.

Referring to FIG. 4, a vacuum pencil holder 500 according to the invention includes an elongated supportive member 100, a first bearing member 200a, a second bearing member 200b, and a turnable holding member 300.

Figure 2:
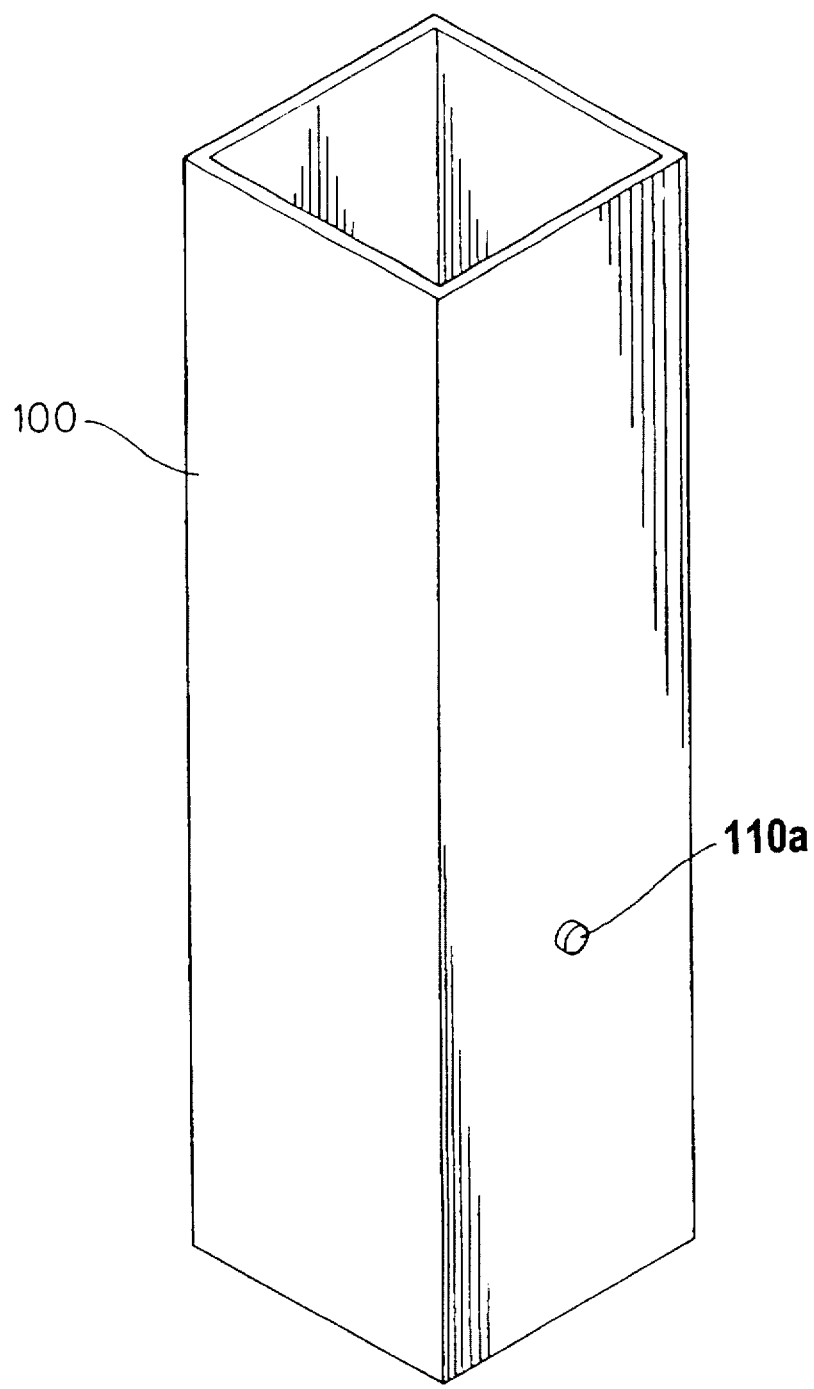
FIG. 2 is a perspective view of an elongated supportive member.

Referring to FIG. 2, the elongated supportive member 100 is an oblong member having a peg 110a on its outer wall. The elongated supportive member 100, for example, can be the leg of a desk where a fabrication engineer works or an upright post mounted on the desk. In the preferred embodiment, however, the elongated supportive member 100 is a part of the invention, and is a separate member, square in cross section, having a hollowed inside so that the supportive member fits over a post or a desk leg.

The first and second bearing members 200a, 200b are identical in structure, so that the detailed description thereof in the following is directed only to the first bearing member 200a, with reference to FIGS. 3A–3B.

Figure 3A:
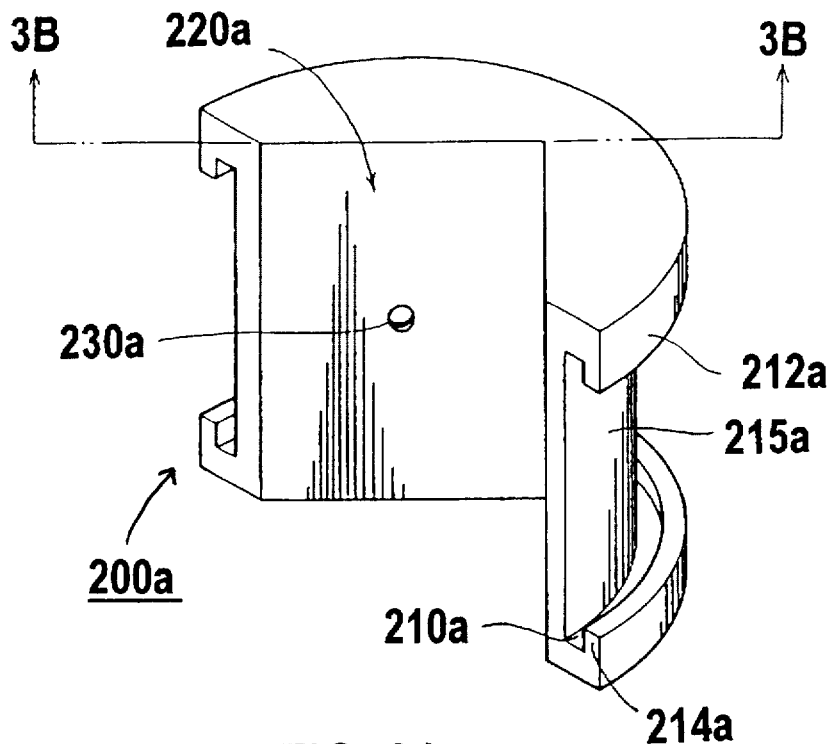
FIG. 3A is a perspective view of a bearing member.
Figure 3B:
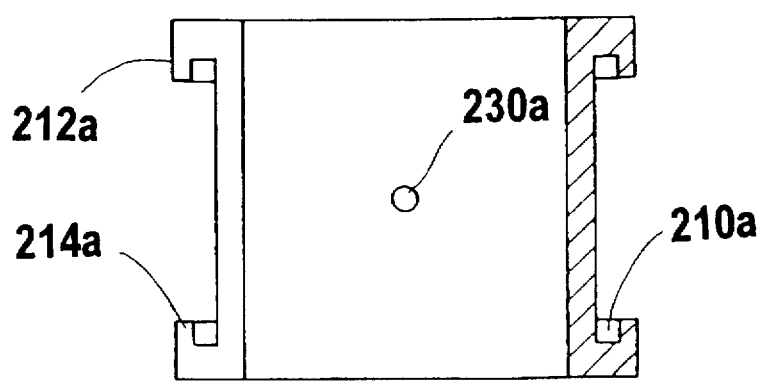
FIG. 3B is a sectional view of the bearing member of FIG. 3A.

As shown in FIG. 3A, the first bearing member 200a is a half-cylindrical member having a curved top end 212a and a curved bottom end 214a on which are respectively provided a top flange portion 212a and a bottom flange portion 214a.

Outer rims of the top flange portion 212a and the bottom flange portion 214a are bent so as to define therebetween a half-circular slot 210a around an outer curved surface 215a. Further, the bearing member 200a has an inner surface shaped to define a cutaway portion 220a which is cut in such a manner as to match the shape of the elongated supportive member 100 to which the bearing member 200a is to be attached. For example, in this embodiment the elongated supportive member 100 is square in section, so that the cutaway portion 220a is correspondingly shaped with a 90° corner that allows the bearing member 200a to be attached to one corner of the elongated supportive member 100. The bearing member 200a also has a hole 230a which is shaped to receive the peg 110a on the elongated supportive member 100. The peg 110a and the hole 230a in combination thereby form a fastening means for securely fastening the first securing member 200a to the elongated supportive member 100.

Figure 5:
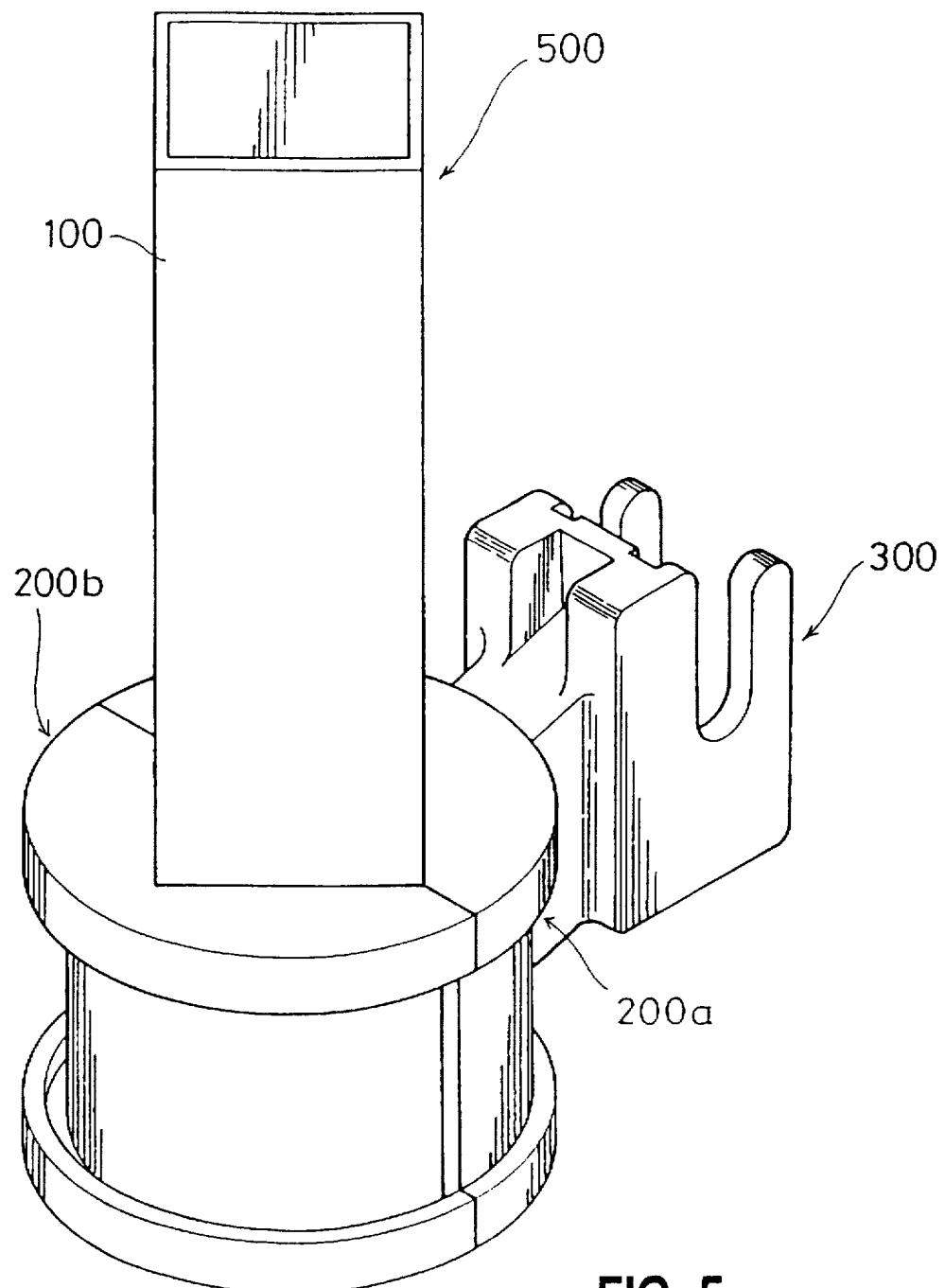
FIG. 5 is a perspective view of the assembled vacuum pencil holder, fastened to the elongated supportive member of FIG. 2.

Referring to FIG. 4 together with FIG. 5, the second bearing member 200b, has parts that are identical to those of the first bearing member 200a and are designated by the same reference numbers except the suffix b rather than a is used. The first bearing member 200a and the second bearing member 200b can be attached to respective opposite corners of the elongated supportive member 100 by fitting the respective holes 230a and 230b over the respective pegs 110a and 110b. This combines the two bearing members 200a, 200b into a cylindrical bearing member fixedly mounted around the elongated supportive member 100.

Figure 1:
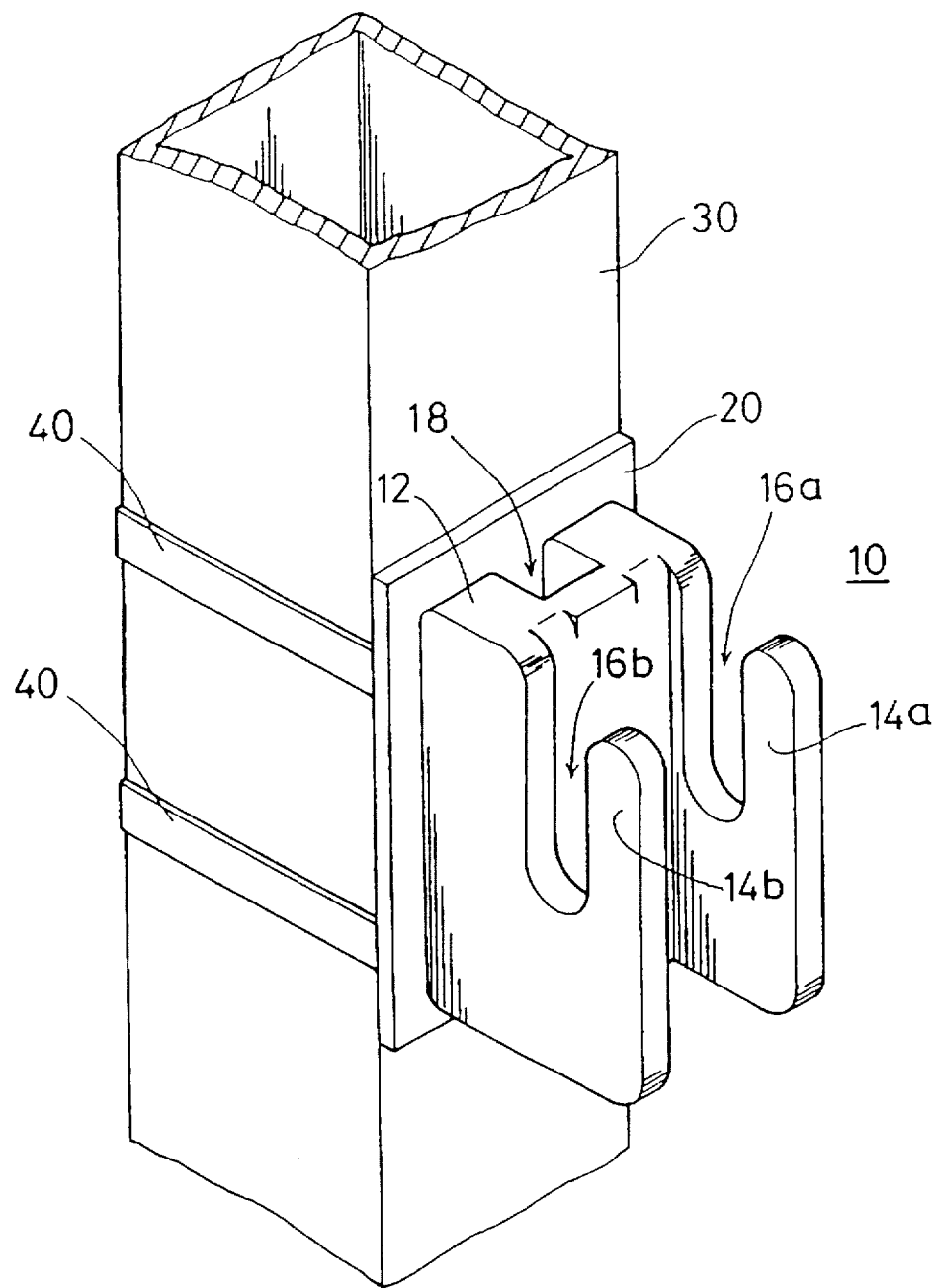
FIG. 1 is a perspective view of a conventional vacuum pencil holder.

The turnable holding member 300 includes a curved piece 310 and a wand stand 320. The curved piece 310 is integrally joined to the wand stand 320 by means of screws 324. The wand stand 320 is substantially identical in structure to the wand stand 12 in the prior art vacuum pencil holder of FIG. 1, including a pair of finger-like portions 321a, 321b which define a pair of slots 322a, 322b for holding a vacuum pencil (not shown), and a recess 323 on the back. The curved piece 310 is inset in the half-circular slots 210a, 210b on the first and second bearing members 200a, 200b.

When the first and second bearing members 200a, 200b are attached to the elongated supportive member 100, the half-circular slots 210a, 210b thereon are also joined to form a circular path allowing the curved piece 310 to be slidable therearound.

Thus, when the curved piece 310 is disposed within the half-circular slots 210a, 210b, the curved piece 310 holds the first and second bearing members 200a, 200b together as a cylindrical bearing member. This is true as long as the curved piece 310 spans both bearing members 200a, 200b. Alternatively, each bearing member 200a, 200b may include a hole 230a, 230b, for engaging corresponding pegs 110a, 110b of the elongated supporting member 100 so as to make a removably fixed connection, such as a snap connection. This connection is sufficiently fixed that the bearing members 200a, 200b remain in place on the elongated supporting member 100, yet allow the bearing members 200a, 200b to be easily removed.

As shown in FIG. 5, with the curved piece 310 slidably inset in the circular slots (210a and 210b combined), the turnable holding member 300 can be turned about the elongated supportive member 100. This allows the wand stand 320 to be adjusted in angular position so that the vacuum pencil (not shown) placed thereon can always be placed at a position within convenient reach of the fabrication engineer.

The invention has been described with reference to an exemplary preferred embodiment. However, it is to be understood that the scope of the invention is not limited to the disclosed embodiment. To the contrary, it is intended to cover various modifications and similar arrangements. The scope of the claims should be accorded the broadest interpretation so as to encompass all such modifications and similar arrangements.

What is claimed is:

1. A vacuum pencil holder for holding a vacuum pencil, said vacuum pencil holder comprising:

(a) a wand stand;

(b) a curved piece joined to said wand stand;

(c) a pair of bearing members, each bearing member being substantially half-cylinder shaped and having an outer curved surface and an inner surface, opposite said outer surface, said inner surface defining a cutaway portion formed with a corner, each bearing member further having first and second curved ends respectively formed with first and second flanges defining a pair of half-circular slots on said outer curved surface; and (d) means for fastening said pair of bearing members securely on an elongated supportive member having a polygonal shape in cross section, and having a peripheral surface matching a shape of the cutaway portions, said pair of bearing members, when fastened to the elongated supportive member, forming a cylindrical bearing member surrounding the elongated supportive member, wherein said curved piece is slidably disposable in said half-circular slots on said pair of bearing members when said pair of bearing members is fastened to the elongated supportive member, whereby said wand stand is turnable about the elongated supportive member.

2. The vacuum pencil holder of claim 1, wherein the elongated supportive member includes at least one peg, and wherein said fastening means includes at least one hole in said pair of bearing members, for receiving the peg on the elongated supportive member when said pair of bearing members are fastened to the elongated supportive member.

3. The vacuum pencil holder of claim 1, wherein the elongated supportive member is square in cross-section, and said cutaway portion is formed with a 90° corner.

4. The vacuum pencil holder of claim 3, wherein said pair of bearing members are adapted to be attached to opposite corners of the elongated supportive member.

5. A vacuum pencil holder for holding a vacuum pencil, comprising:

(a) an elongated supportive member having a polygonal shape in cross section;

(b) a wand stand;

(c) a curved piece joined to said wand stand;

(d) a pair of bearing members, each of which is substantially half-cylinder shaped having an outer curved surface and an inner surface, opposite said outer cylindrical surface, defining a cutaway portion and formed with a corner, each bearing member further having first and second curved ends respectively formed with first and second flanges defining a pair of half-circular slots on said outer curved surface, said pair of bearing members disposed on opposite sides of said elongated supportive member so as to form a cylindrical bearing member surrounding said elongated supportive member; and (e) fastening means removably fastening said pair of bearing members securely on said opposite sides of said elongated supportive member, wherein said curved piece is slidably inset in said half-circular slots on said pair of bearing members, whereby said wand stand is turnable about said elongated supportive member.

6. The vacuum pencil holder of claim 5, wherein said fastening means includes at least one peg on said elongated supportive member.

7. The vacuum pencil holder of claim 6, wherein said fastening means includes at least one hole in said pair of bearing members, said hole receiving said peg on said elongated supportive member.

8. The vacuum pencil holder of claim 5, wherein said elongated supportive member is square in cross-section.

9. The vacuum pencil holder of claim 8, wherein said cutaway portion of each bearing member is formed with a 90° corner matching in shape with a respective one corner of said elongated supportive member, said pair of bearing members being removably attached to opposite corners of said elongated supportive member.

* * * * *